United States Patent
Chan

(10) Patent No.: US 8,730,739 B2
(45) Date of Patent: May 20, 2014

(54) SEMICONDUCTOR DEVICE FOR ACCELERATING ERASE VERIFICATION PROCESS AND METHOD THEREFOR

(75) Inventor: Tony Chan, Chu-Pei (TW)

(73) Assignee: Eon Silicon Solution Inc. (TW)

( * ) Notice: Subject to any disclaimer, the term of this patent is extended or adjusted under 35 U.S.C. 154(b) by 368 days.

(21) Appl. No.: 13/351,361

(22) Filed: Jan. 17, 2012

(65) Prior Publication Data

US 2013/0182508 A1    Jul. 18, 2013

(51) Int. Cl.
*G11C 16/24* (2006.01)

(52) U.S. Cl.
USPC ...................................... 365/185.22; 365/201

(58) Field of Classification Search
CPC .......................... G11C 16/3445; G11C 2029/04
USPC ............ 365/185.09, 185.22, 185.23, 200, 201
See application file for complete search history.

(56) References Cited

U.S. PATENT DOCUMENTS

| | | | |
|---|---|---|---|
| 5,499,211 A * | 3/1996 | Kirihata et al. | 365/203 |
| 2003/0210581 A1* | 11/2003 | Lee et al. | 365/200 |
| 2006/0050564 A1* | 3/2006 | Kojima et al. | 365/185.22 |
| 2007/0030735 A1* | 2/2007 | Crippa et al. | 365/185.12 |
| 2011/0216602 A1* | 9/2011 | Kim et al. | 365/185.22 |

* cited by examiner

*Primary Examiner* — Douglas King

(74) *Attorney, Agent, or Firm* — Schmeiser, Olsen & Watts, LLP

(57) ABSTRACT

A semiconductor device and a method for accelerating erase verification process thereof are introduced, in which a correction unit of erase verification is connected between broken bit lines of the semiconductor device and a page buffer. Grounding switches in the correction unit of erase verification are allowed to connect the broken bit lines to ground during an erase verification process by means of a specific circuit arrangement with respect to the broken lines. Thereby, the earth voltage is received, and further, that the broken bit lines pass the erase verification is identified by the page buffer, further saving time consumed in repeated verifications in the conventional technology significantly.

4 Claims, 2 Drawing Sheets

Figure 1:
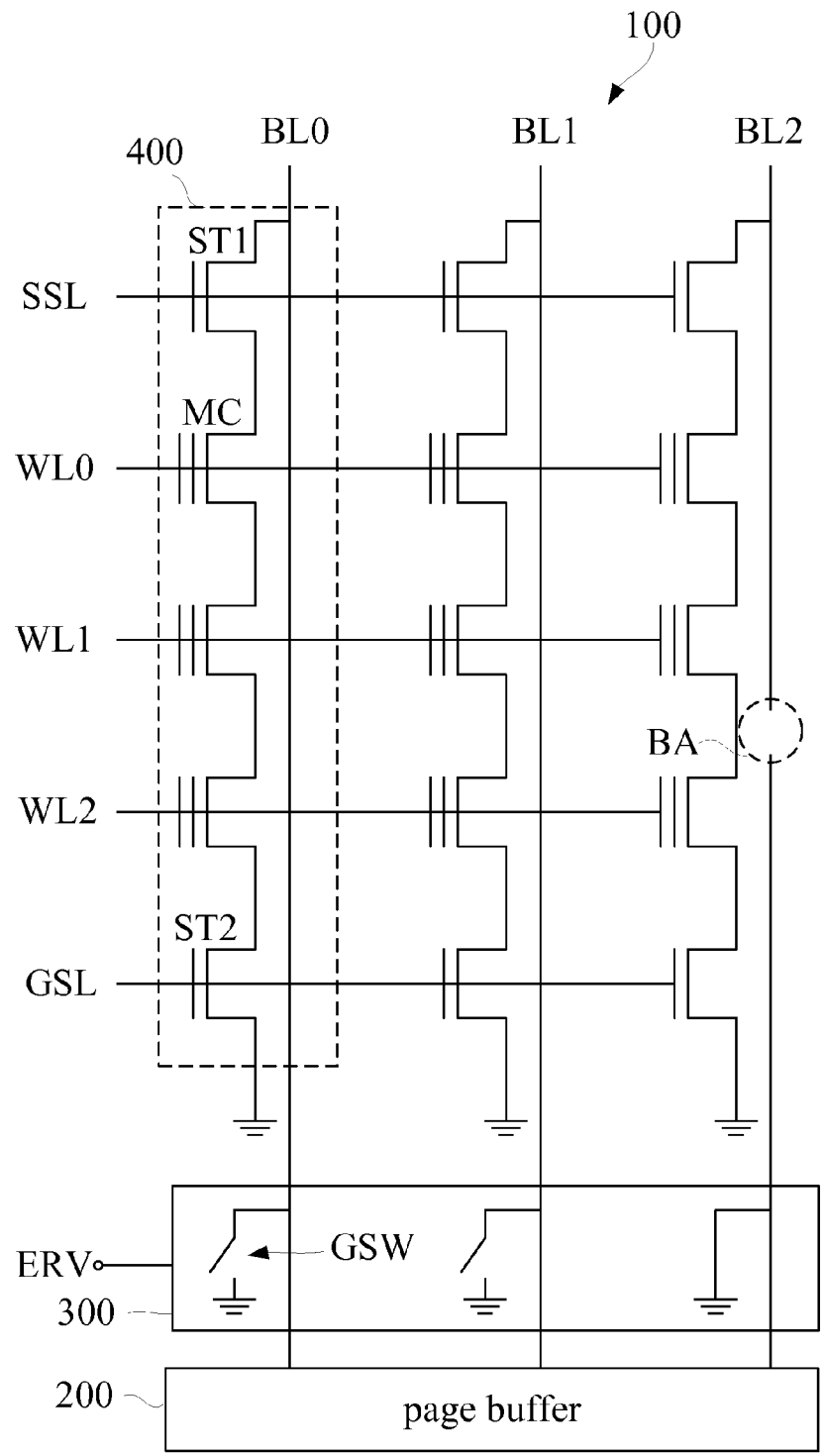

SEMICONDUCTOR DEVICE FOR ACCELERATING ERASE VERIFICATION PROCESS AND METHOD THEREFOR

FIELD OF TECHNOLOGY

The present invention is related to a semiconductor device and an operation method therefor, particularly to a semiconductor device and an operation method therefor for solving the erase verify problem with broken bitline.

BACKGROUND

In a flash memory device, a verification operation is required to confirm that charges are injected into memory cells suitably by means of programmed operation. If the verification operation fails, the programmed operation and verification operation may be repeated, until the result of verification operation shows success or meets specific conditions (for instance, repeated 100 verification failures).

During the erase operation, a verification operation is similarly conducted, so as to confirm that charges are suitably removed from the memory cells until Vth of the memory cells are –ve. Vth is the gate voltage require to turn on floating gate core cell. When pgm/erase the core cell, that voltage will be modified. The terms "–ve (negative)" and "Vth" mean that the core cell is turn on even gate voltage is 0V. The erase verification is conducted such that the bitline is precharge to a voltage level and erased cells discharge the bitline. A page buffer connected at the end of the bitline and verify discharged bitline. Page buffer output a signal of passing verification if all selected bitlines are discharged.

Once breakage of a bit line occurs in the memory cell due to defects or other failures in manufacturing process, the memory cell having broken bit line is replaced by a redundant memory cell. However, the verification procedure, originated from an instruction of erase verification ERV, with respect to the broken bitline is still verify, and is not stopped until timeout.

SUMMARY

It is one object of the present invention to provide a method and device to bypass the broken bitline(s).

For achieving the above object and other objects, the present invention provides a semiconductor device for solving the erase verify problem with broken bitline and accelerating erase verification process, comprising a page buffer, and a memory cell array having a plurality of bit lines therein, the bit lines receiving an instruction of erase verification, characterized in further comprising: a correction unit of erase verification connected between the bit lines and the page buffer, the correction unit of erase verification having a plurality of grounding switches which, connected to the bit lines correspondingly, are set such that broken lines of the bit lines are connected to ground when the instruction of erase verification is received.

For achieving the above object and other objects, the present invention further provides a method for erase verification process of a semiconductor device, the semiconductor device comprising a page buffer, and a memory cell array having a plurality of bit lines therein, the method comprising: acquiring an address of a broken bit line in the memory cell array; connecting a correction unit of erase verification between the bit lines and the page buffer, and connecting a plurality of grounding switches of the correction unit of erase verification to the bit lines correspondingly; and setting the grounding switches, based on the address of the broken bit-line column, so as to connect the grounding switch, connected to the broken bit line, to ground when an instruction of erase verification is received by the correction unit of erase verification.

In one embodiment, the grounding switches are set, such that the rest of bit lines, which are not broken, are also connected to the earth voltage when the instruction of erase verification is received.

In one embodiment, the grounding switches connected to the rest of bit lines are also connected to the earth voltage when the instruction of erase verification is received by the correction unit of erase verification.

Thereby, in the present invention, the correction unit of erase verification is allowed to output a predetermined voltage signal to the page buffer while the erase verification process is conducted, by means of a specific circuit arrangement with respect to the broken bit lines. In this connection, it may be identified by the page buffer that the broken lines pass the erase verification, prevent the verify fail because of the broken bitline.

BRIEF DESCRIPTION

Figure 2:
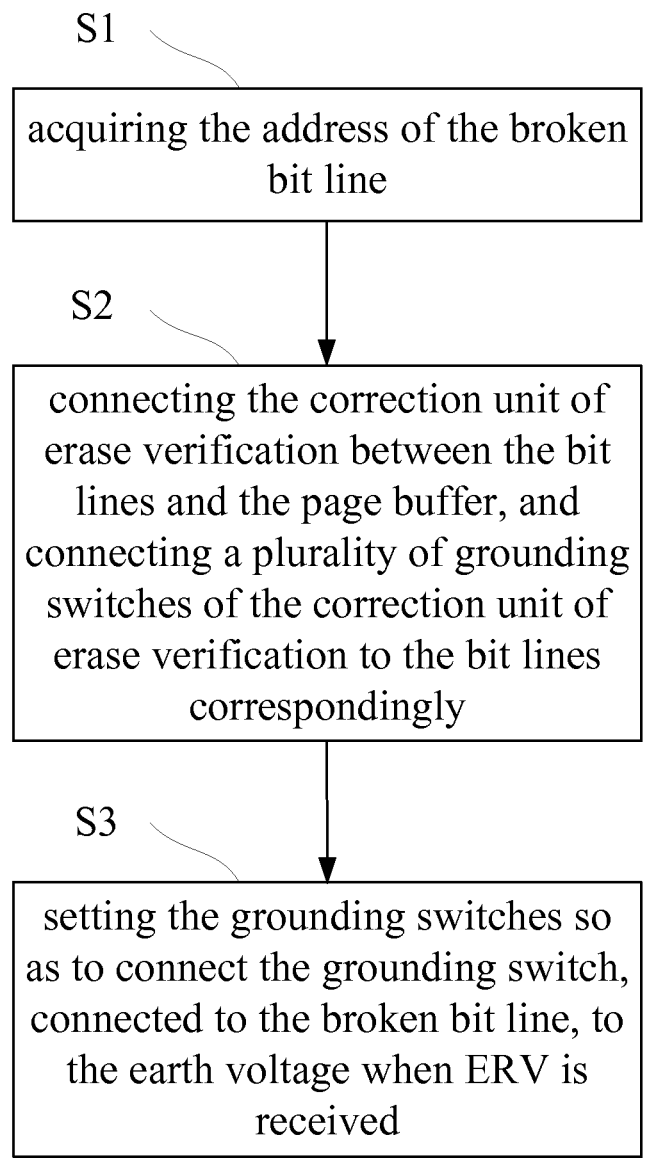

FIG. 1 is a circuit block diagram of a NAND flash memory device of semiconductor device according to one embodiment of the present invention; and FIG. 2 is a flow chart illustrating a method for accelerating erase verification process of the NAND flash memory device of semiconductor device according to one embodiment of the present invention.

DETAILED DESCRIPTION

A detailed description will be made to the present invention by means of following embodiments in cooperation with accompanied drawings for fully understanding the objects, features and effects of the present invention.

Referring to FIG. 1, firstly, there is shown a circuit block diagram of a NAND flash memory device of semiconductor device according to one embodiment of the present invention under the erase verification condition. A memory cell array 100 in FIG. 1 is illustrated as three NAND strings. In this illustration, each NAND string 400 comprises a string select transistor ST1, a ground select transistor ST2 and three memory cells MC.

The array comprises multiple memory cells MC in series and select by SSL/GSL. Erase will erase the selected memory cells to negative Vth (negative Vth mean memory cell turn on even gate voltage=0V). Therefore selected BL will be discharged by the selected string when memory cells's Vth is low enough.

The memory cell array 100 comprises a plurality of memory cells MC, each connected in series between a bit line (BL0, BL1 or BL2) and a ground select line GSL. In this connection, the memory cells MC connected in series with the bit line (BL0, BL1 or BL2), the string select transistor ST1 and the ground select transistor ST2 are referred to as one NAND string 400. The string select transistor ST1 and the ground select transistor ST2 are used to select the memory cell MC to be operated. Moreover, the turning on or turning off of the string select transistor ST1 is determined by the condition of a string select line SSL. "The string select transistor ST1 is selectively switched, so as to couple with the related memory cell string and bit line. The ground select transistor ST2 is then selectively switched, so as to control the electrical connection between each NAND string 400 and a common source line (not shown in this figure) and bitline". ST1 connects to BL and ST2 connects to common source.

As illustrated in FIG. 1, a column of the memory cell array 100 is composed of one bit line and one NAND string 400. Word lines (WL0, WL1 and WL2) are served as rows of the memory cell array 100. Each of the word lines is connected to the control gate of each memory cell MC in each row.

When the bit line connected to the NAND string 400 in the memory cell array 100 is broken, such as a broken area BA illustrated in FIG. 1, for example, although each NAND string 400 is connected to the ground by an instruction of erase, it is incapable for the NAND string having broken bit line to discharge the bitline voltage to ground, where the page buffer 200 verify discharged bitlines to determine erase verify passed. Thus, it is incapable in the conventional art for the page buffer 200 to send a pass signal of ERV (i.e., the ground voltage of NAND string having being received by the buffer 200), in such a way that the verification process may be conducted repeatedly on the broken bit line.

In view of this, a correction unit of erase verification 300 is further added to the present invention. This unit is a hardware block comprising a plurality of grounding switch GSW operated as a logic gate. Each column of the memory cell array is subject to a function test with respect to the column of the memory cell array after it is manufactured, and an erroneous or failed column then replaced by a redundant column of the memory cell array. Therefore, the address of broken column of the memory cell array can be acquired easily.

In the present invention, therefore, the correction of the erase verification is conducted on the basis of the address of the erroneous or broken column of the memory cell array acquired when the manufacturing process is completed. The correction unit of erase verification 300 is connected between the bit lines (BL0, BL1, BL2) and the page buffer 200, in which each of the bit lines is connected with a grounding switch GSW, correspondingly. Each of the grounding switches GSW is set on the basis of the address of the erroneous or broken column of memory cell, such that the grounding switch GSW to which the broken bit line corresponds is allowed to connect to ground only when the instruction of erase verification ERV is received. Furthermore, it may be identified by the page buffer 200 that the broken line passes the erase verification, further reducing time consumed in repeated verifications in the conventional technology.

The specific corrected setting with respect to the grounding switches GSW connected to the rest of bit lines, which are in normal condition, is not necessary, because the healthy NAND strings can discharge bitline in ERV period. In one embodiment, however, the grounding switches GSW connected to the normal bit lines may be also set, such that the grounding switches GSW are connected to the earth voltage when the instruction of erase verification ERV is received correspondingly.

The functional operation of the correction unit of erase verification 300 and the grounding switches GSW stated above may be readily accomplished by a variety of logic gates or other equivalent elements, which may be readily achieved by those having ordinary skill in the art. Therefore, the arrangement of logic elements in the correction unit of erase verification 300 is not further described herein.

Referring to FIG. 2, subsequently, there is shown a flow chart illustrating a method for accelerating erase verification process of the NAND flash memory device of semiconductor device according to one embodiment of the present invention.

The semiconductor device comprises a page buffer, and a memory cell array having a plurality of bit lines therein, the method to resolve erase verify with broken bitline comprising:

(S1) acquiring the address of a broken bit line in the memory cell array;

(S2) connecting a correction unit of erase verification between the bit lines and the page buffer, and connecting a plurality of grounding switches of the correction unit of erase verification to the bit lines correspondingly;

(S3) setting the grounding switches, based on the address, so as to connect the grounding switch, connected to the broken bit line, to ground when an instruction of erase verification is received by the correction unit of erase verification.

The embodiment of the present invention is exemplified by one broken line. A correction unit of erase verification with different driving capability, however, may be selected on the basis of broken situation of bit lines of the memory cell array when the present invention is embodied practically. For instance, when 50 broken bit lines corresponding to 50 strings of NAND occur in the memory cell array, the correction unit of erase verification must be connected in series between 50 bit lines and at least one page buffer, and also, must be capable of providing 50 sets of predetermined voltage signals to the at least one page buffer.

To sum up, in the present invention, the correction unit of erase verification is allowed to output a predetermined voltage signal to the page buffer while the erase verification process is conducted, by means of a specific circuit arrangement with respect to the broken bit lines. In this connection, it may be identified by the page buffer that the broken lines pass the erase verification, further saving time consumed in repeated verifications in the conventional technology.

The present invention is disclosed by embodiments in foregoing description. However, it should be understood by those skilled in the art that the embodiments are merely used for describing the present invention and not considered as restrictive. It should be noted, that all equivalent variations and substitutions may be included within the scope of the present invention. Therefore, the present invention to be protected should be defined by appended claims.

What is claimed is:

1. A semiconductor device for accelerating erase verification process, comprising a page buffer, and a memory cell array having a plurality of bit lines therein, said bit lines receiving an instruction of erase verification, characterized in that it further comprises:

a correction unit of erase verification, connected between said bit lines and said page buffer, said correction unit of erase verification having a plurality of grounding switches which, connected to said bit lines correspondingly, are set such that broken lines of said bit lines are connected to an earth voltage only when said instruction of erase verification is received.

2. The semiconductor device according to claim 1, wherein said grounding switches are set, such that the rest of bit lines, which are not broken, are also connected to ground when said instruction of erase verification is received.

3. A method for accelerating erase verification process of a semiconductor device, said semiconductor device comprising a page buffer, and a memory cell array having a plurality of bit lines therein, said method comprising:

acquiring an address of a broken bit line in said memory cell array;

connecting a correction unit of erase verification between said bit lines and said page buffer, and connecting a plurality of grounding switches of said correction unit of erase verification to said bit lines correspondingly; and setting said grounding switches, based on said address, so as to connect said grounding switch, connected to said broken bit line, to an earth voltage when an instruction of erase verification is received by the correction unit of erase verification.

4. The method according to claim 3, wherein said grounding switches connected to the rest of bit lines are also connected to the earth voltage when said instruction of erase verification is received by said correction unit of erase verification.

\* \* \* \* \*